(12) United States Patent
Anghel et al.

(10) Patent No.: US 7,615,892 B2
(45) Date of Patent: Nov. 10, 2009

(54) MODULAR AND SCALABLE POWER CONVERSION SYSTEM FOR AIRCRAFT

(75) Inventors: Cristian E. Anghel, Oro Valley, AZ (US); Wayne T. Pearson, Oro Valley, AZ (US)

(73) Assignee: Honeywell International Inc., Morristown, NJ (US)

( * ) Notice: Subject to any disclaimer, the term of this patent is extended or adjusted under 35 U.S.C. 154(b) by 267 days.

(21) Appl. No.: 11/594,847

(22) Filed: Nov. 9, 2006

(65) Prior Publication Data

US 2008/0111421 A1 May 15, 2008

(51) Int. Cl.
*H02J 9/00* (2006.01)
(52) U.S. Cl. .............................. 307/68; 307/64; 290/52
(58) Field of Classification Search ............. 307/64–68, 307/73, 87; 318/140, 146, 148, 440, 500, 318/732, 801, 400.17; 290/40 B, 52, 46, 290/31, 39; 322/10, 46, 59, 47; 363/37, 363/34, 39, 41
See application file for complete search history.

(56) References Cited

U.S. PATENT DOCUMENTS

| | | | |
|---|---|---|---|
| 3,846,693 A | 11/1974 | Compoly et al. | |
| 4,468,725 A | 8/1984 | Venturini | |
| 4,786,852 A | 11/1988 | Cook | |
| 4,947,100 A | 8/1990 | Dhyanchand et al. | |
| 4,968,926 A | 11/1990 | Dhyanchand | |
| 5,040,105 A | 8/1991 | Dhyanchand et al. | |
| 5,041,957 A | 8/1991 | Dhyanchand et al. | |
| 5,041,958 A | 8/1991 | Dhyanchand et al. | |
| 5,043,857 A | 8/1991 | Kirchberg, Jr. et al. | |
| 5,434,771 A | 7/1995 | Danby et al. | |
| 6,037,752 A | 3/2000 | Glennon | |
| 6,215,202 B1 * | 4/2001 | Luongo et al. | 307/64 |
| 6,381,157 B2 | 4/2002 | Jensen | |
| 6,487,096 B1 | 11/2002 | Gilbreth et al. | |
| 6,603,672 B1 | 8/2003 | Deng et al. | |
| 6,778,414 B2 | 8/2004 | Chang et al. | |
| 6,877,581 B2 * | 4/2005 | Badr et al. | 180/311 |
| 2003/0007369 A1 | 1/2003 | Gilbreth et al. | |
| 2003/0214824 A1 | 11/2003 | Corzine | |
| 2004/0129835 A1 | 7/2004 | Atkey et al. | |

* cited by examiner

*Primary Examiner*—Rajnikant B Patel
(74) *Attorney, Agent, or Firm*—Oral Caglar, Esq.

(57) ABSTRACT

A method and apparatuses are used for power conversion. The apparatus according to one embodiment comprises a plurality of power conversion modules (130_1, ..., 130_n), the plurality of power conversion modules (130_1, ..., 130_n) being optionally controllable to function independently of each other to supply a plurality of systems (200_1, ..., 200_n), function in an inter-relational mode in which at least one power conversion module from the plurality of power conversion modules (130_1, ..., 130_n) drives a system and, upon a failure of the at least one power conversion module, at least another power conversion module from the plurality of power conversion modules (130_1, ..., 130_n) will drive the system, and function in a scalable mode in which at least two power conversion modules of the plurality of power conversion modules (130_1, ..., 130_n) are connected to provide an additive output.

18 Claims, 7 Drawing Sheets

MODULAR AND SCALABLE POWER CONVERSION SYSTEM FOR AIRCRAFT

CROSS REFERENCE TO RELATED APPLICATION

This non-provisional application is related to co-pending non-provisional application titled "An Architecture and a Multiple Function Power Converter for Aircraft" filed concurrently herewith, the entire contents of which are hereby incorporated by reference.

BACKGROUND OF THE INVENTION

1. Field of the Invention

The present invention relates to power conversion systems, and more particularly to a method and apparatus for a modular and scalable power conversion system for an aircraft.

2. Description of the Related Art

Electric systems used in complex environments such as aerospace systems, more electric aircraft systems, industrial environments, vehicles, etc., include a large number of electric systems and modules. During operation of such complex environments, various electric systems and modules may need to be connected to electric power sources, disconnected from electric power sources, maintained in a powered-up state, etc., at various times. Moreover, various electric systems and modules in a complex environment may require different amounts and type of electrical power. For example, some electric systems and modules may require DC power while others may require AC power. Some electric systems and modules may require 28 Vdc, others 230 Vac, yet others 115 Vac at 400 Hz. The power levels required by various parts of a complex environment may also depend on the operational stage of the environment. For example, different levels of power may be needed during a start-up and during a continuous operation of a complex environment, such as an aircraft.

Aircraft are currently being designed to use less non-electric power (such as hydraulic and pneumatic power) and more electrical power. Aircraft system architectures that rely solely, or to a great extent, on electrical power, are also referred to as More Electric Aircraft (MEA) system architectures. Typically, MEA system architectures use starter-generators to start the aircraft main engines, as well as supply electrical power to various system loads that may utilize electrical power at various frequencies and voltages. Hence, many MEA system architectures, and/or starter-generators currently used to power MEA system architectures, typically include relatively complex power electronics circuits with large weight. In these heavy power electronics circuits, motor controllers are used for main engine start and after the start, to supply the motors in the Environmental Control System (ECS) or other motor loads in the aircraft systems, such as hydraulic system loads.

One such power system architecture for aircraft is described in patent application US 2004/0129835 A1, by W. Atkey et al. In this patent application, an electric power distribution system includes AC generators. High voltage AC power can be converted to high voltage DC power by one or more AC-to-DC conversion devices, such as auto transformer rectifier units (ATRUs), that receive AC power from AC busses. Using the ATRUs, the power distribution system provides high voltage AC and DC power to support conventional 115V and 28 Vdc bus architectures. An output from an ATRU is alternatively connected to an AC generator during start, and to a load such as an air compressor system, during normal operation.

However, typical/conventional power conversion systems place design constraints on the generating and conversion equipment such as the motor controllers, since the design of the generating and conversion equipment is heavily dependent on the larger power typically required to achieve the main engine start. The output current required for main engine start is 2 to 5 times larger than the current required to drive motors in the ECS or in other systems. This discrepancy in power requirements leads to designs with large output ratings, and imposes weight, volume and cost penalties on existing aircraft systems, resulting in sub-optimal approaches to the design of architectures used for MEA. Moreover, in typical/conventional power generation and conversion systems, the availability of the start system is negatively affected, because a failure of one of the motor controllers used for start removes at once the start capability for the starter generator associated with the failed controller.

Disclosed embodiments of this application address these and other issues by utilizing a modular and scalable power conversion system consisting of power conversion modules, which are designed and optimized for continuous operation when they supply motors used in aircraft systems, or aircraft busses with fixed frequency. During main engine start, a number of power conversion modules are operated in parallel and used to supply start power to a starter generator. The power conversion modules may be controlled for connection to any starter generator or motor in the electric system, hence allowing for power conversion modules to be designed for much lower ratings, to realize weight, volume and cost savings. In the power conversion system described in the current application, the availability of the start system is increased over previous systems, because a failure of one of the power conversion modules used in parallel during start will remove only partially the start capability, as the other connected power conversion modules are able to supply start power.

SUMMARY OF THE INVENTION

The present invention is directed to a method and apparatuses for power conversion. According to a first aspect of the present invention, a power conversion apparatus comprises: a plurality of power conversion modules, the plurality of power conversion modules being optionally controllable to function independently of each other to supply a plurality of systems, function in an inter-relational mode in which at least one power conversion module from the plurality of power conversion modules drives a system and, upon a failure of the at least one power conversion module, at least another power conversion module from the plurality of power conversion modules will drive the system, and function in a scalable mode in which at least two power conversion modules of the plurality of power conversion modules are connected to provide an additive output.

According to a second aspect of the present invention, a power conversion module comprises: an input assembly; a 3 phase bridge; an output assembly including at least one isolation device; and a control unit, wherein the control unit controls the 3 phase bridge via a driver, and controls a state of at least one isolation device within the output assembly.

According to a third aspect of the present invention, a method for converting power comprises: controlling a plurality of power conversion modules to function independently of each other to supply a plurality of systems; controlling the plurality of power conversion modules to function in an inter-relational mode in which at least one power conversion module from the plurality of power conversion modules drives a system and, upon a failure of the at least one power conversion module, at least another power conversion module from the plurality of power conversion modules will drive the system; and controlling the plurality of power conversion modules to function in a scalable mode in which at least two power conversion modules of the plurality of power conversion modules are connected to provide an additive output.

BRIEF DESCRIPTION OF THE DRAWINGS

Further aspects and advantages of the present invention will become apparent upon reading the following detailed description in conjunction with the accompanying drawings, in which.

DETAILED DESCRIPTION

Figure 1:
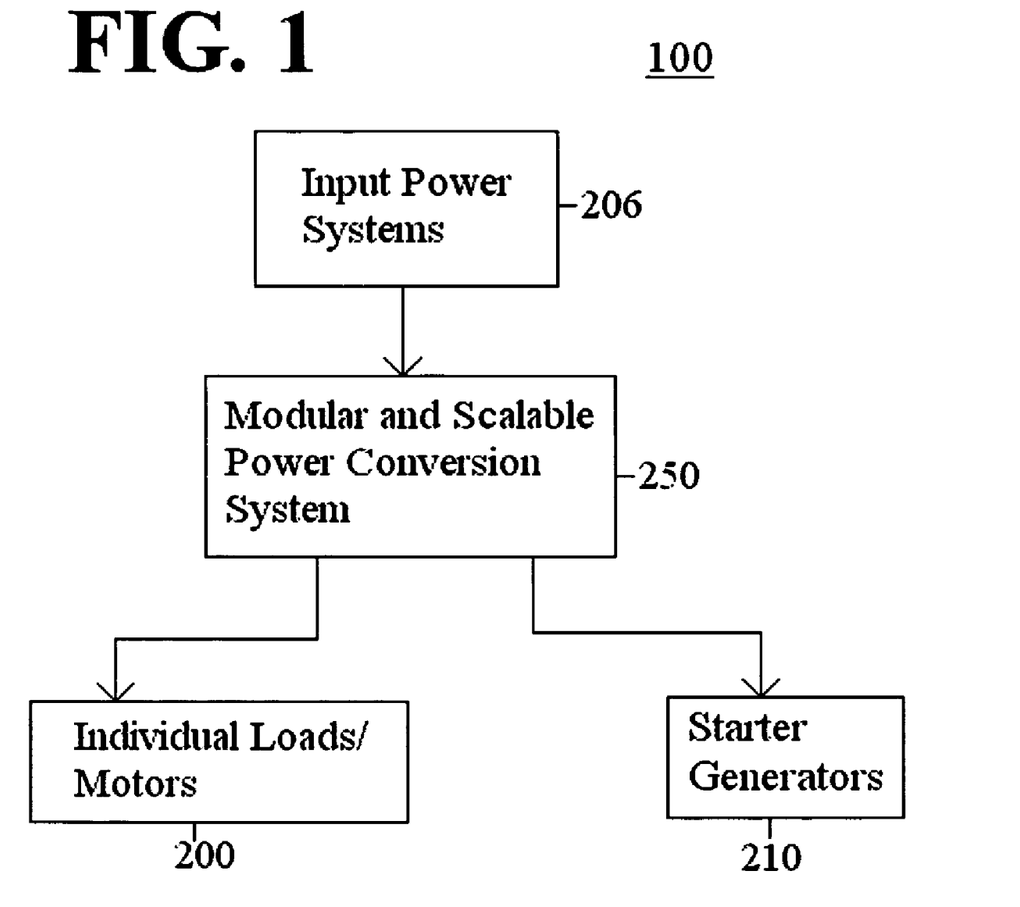
FIG. 1 is a general block diagram of an electrical system to which principles of the present invention can be applied according to an embodiment of the present invention.

Aspects of the invention are more specifically set forth in the accompanying description with reference to the appended figures. FIG. 1 is a general block diagram of an electrical system to which principles of the present invention can be applied according to an embodiment of the present invention. The electrical system 100 illustrated in FIG. 1 includes the following components: input power systems 206; a modular and scalable power conversion system 250; individual loads/motors 200; and starter generators 210. Operation of the electrical system 100 in FIG. 1 will become apparent from the following discussion.

Electrical system 100 may be associated with environments with electrical components such as a cabin air compressor system, a hydraulic system, a heating system, a traction system, etc., in an aircraft, a ship, a train, a laboratory facility, etc. Input power systems 206 provide electrical power to individual loads/motors 200 and starter generators 210, through the modular and scalable power conversion system 250. Input power systems 206 handle wattage power that can be on the order of W, kW, hundreds of kW, MW, etc., and voltages that can be on the order of Volts, hundreds to thousands of Volts, etc. The outputs of input power systems 206 may be DC voltages, AC voltages, etc. Input power systems 206 may include motors, turbines, generators, transformers, filters, circuit breakers, etc.

Modular and scalable power conversion system 250 receives power from input power systems 206, and provides electrical power to individual loads/motors 200 and starter generators 210. Modular and scalable power conversion system 250 includes power conversion modules. Modular and scalable power conversion system 250 may also include other electrical circuits and components such as transformers, rectifiers, filters, battery banks, etc., magnetic components such as coils and permanent magnets, etc.

Individual loads/motors 200 and starter generators 210 are systems that enable functioning of services onboard a vehicle, in an aircraft, in a lab, etc. Individual loads/motors 200 and starter generators 210 may include an air conditioning system, a navigation system, an aircraft control system, a cabin air compressor, a starter generator, a braking system, etc.

Input power systems 206 and modular and scalable power conversion system 250 may provide, and individual loads/motors 200 and starter generators 210 may use various AC or DC voltages. For example, some electrical systems may utilize AC voltages of 115V or 230V or higher, with fixed frequencies (such as, for example, 50/60 Hz or 400 Hz), or variable frequencies (such as, for example 360-800 Hz for aerospace applications, 1000-2000 Hz for high frequency), or DC voltages such as, for example, 28V, 270V, or ±270V.

Although the systems in electrical system 100 are shown as discrete units, it should be recognized that this illustration is for ease of explanation and that the associated functions of certain functional modules or systems can be performed by one or more physical elements.

Figure 2:
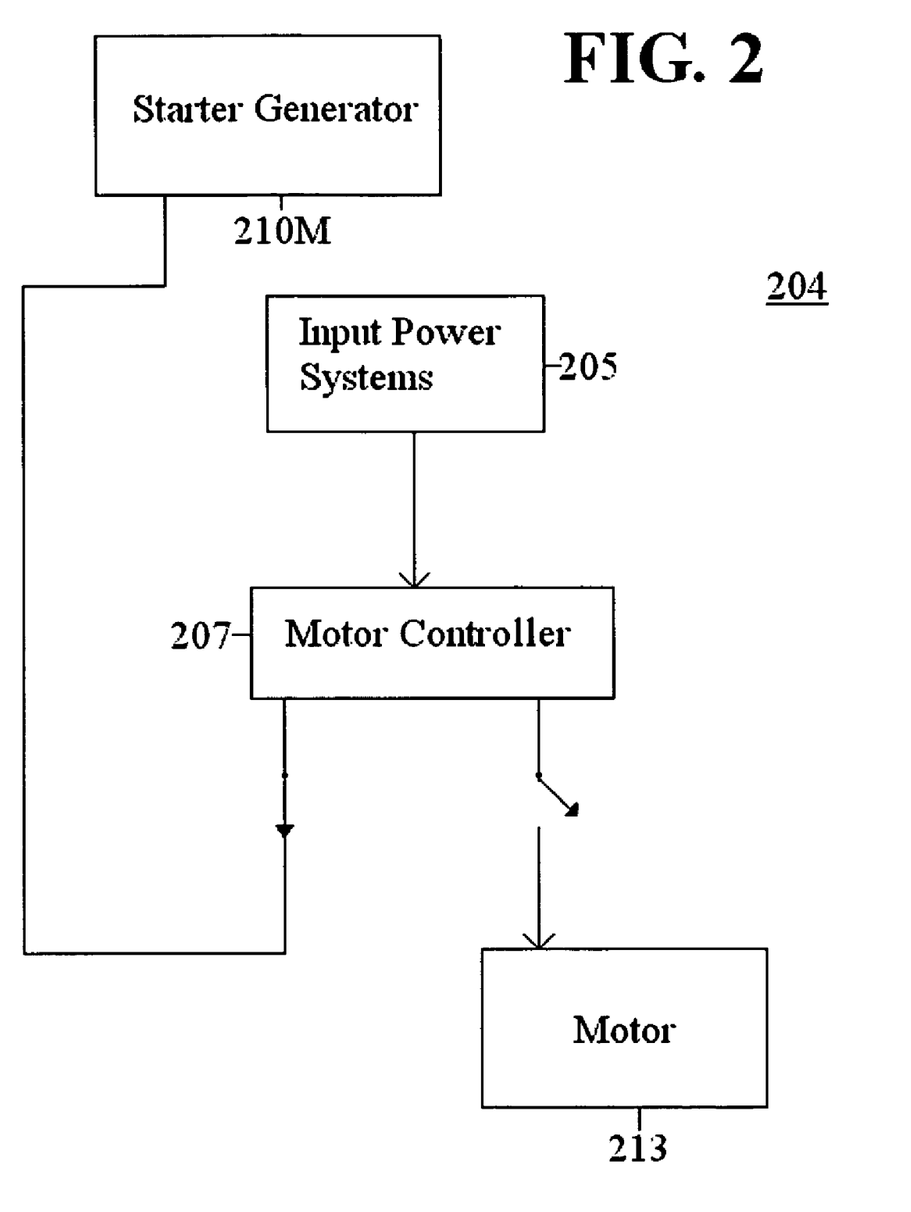
FIG. 2 is a block diagram of a typical/conventional power system for an aircraft.

FIG. 2 is a block diagram of a typical/conventional power system 204 for an aircraft. During the aircraft engine start, a motor controller 207 is used to supply power to the starter generator 210M for main engine start. After the start, motor controller 207 is used to supply a motor 213. The motor 213 may be included in the ECS, in the hydraulic aircraft system, etc. The typical/conventional aircraft power system 204 imposes design constraints on the generating and conversion equipment that includes motor controller 207. Design constraints are imposed on the motor controller 207 because its design is heavily dependent the power required to achieve the main engine start at starter generator 210M. The output current required for main engine start is typically 2 to 5 times larger than the current required to drive the motor 213. This results in a motor controller 207 designed with a large output rating, needed for the main engine start, but not for the subsequent control of an aircraft motor load. This large output rating imposes weight, volume and cost penalties on existing power systems, resulting in sub-optimal approaches to power conversion and distribution. Another negative aspect of the typical/conventional aircraft power system 204 is that the availability of the starter generator 210M is negatively affected, because a failure of the motor controller 207 removes at once the start capability for its associated starter generator.

Figure 3:
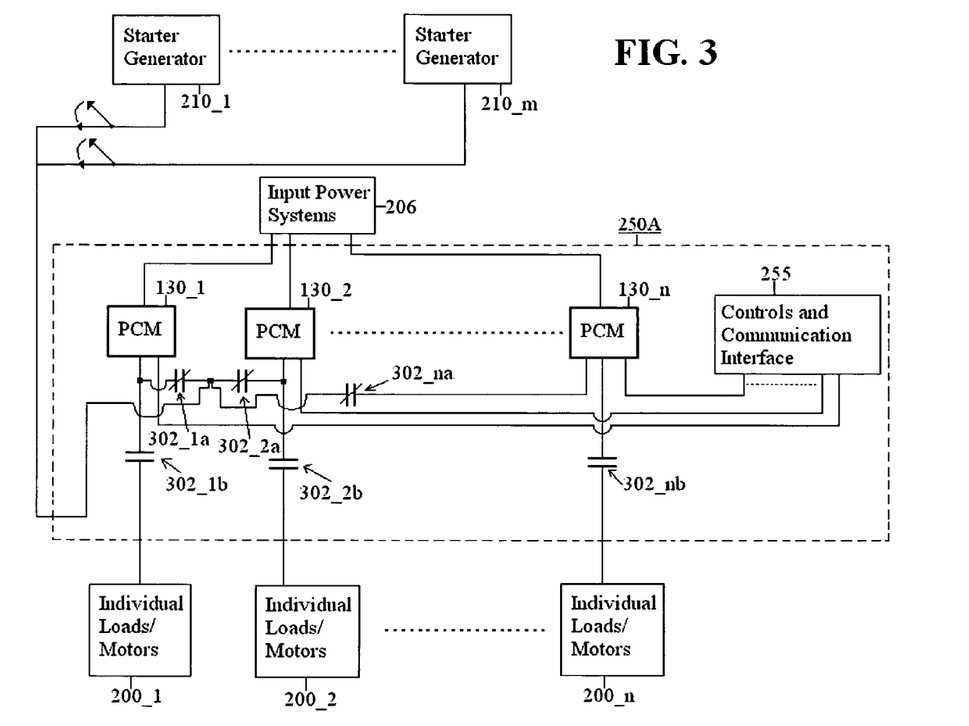
FIG. 3 is a block diagram of a modular and scalable power conversion system for aircraft according to an embodiment of the present invention.

FIG. 3 is a block diagram of a modular and scalable power conversion system 250A for aircraft according to an embodiment of the present invention. As illustrated in FIG. 3, modular and scalable power conversion system 250A includes n power conversion modules (PCMs) 130_1, 130_2, . . . , 130_n. The PCMs are designed and optimized for continuous operation when they supply the loads/motors 200_1, 200_2, . . . , 200_n used in aircraft systems, such as the ECS, the hydraulic system, etc. During main engine start, a certain number of PCMs 130_1, 130_2, . . . , 130_n are operated in parallel and used to supply the start power to a starter generator (SG) 210_1. The aircraft electrical architecture allows to connect each of the PCMs 130_1, 130_2, . . . , 130_*n* to any of the SGs in the electric system, such as SG 210_1, ... 210_*m*, as required for main engine start, auxiliary power unit (APU) start, etc. This approach allows for the PCMs 130_1, 130_2, ..., 130_*n* to be designed for a much lower rating, hence realizing weight, volume and cost savings.

The availability of the start system is increased over typical/conventional systems. In the system illustrated in FIG. 3, a failure of one of the PCM modules 130_1, 1302, ..., 130_*n* used in parallel during start, will remove only partially the start capability of the system, as the other PCM modules which have not failed are still able to supply start power. After the start, some of the PCMs 130_1, 130_2, ..., 130_*n* can be disconnected from the parallel configuration, and used individually for other functions, such as for supplying power to individual loads/motors 200_1, 200_2, ..., 200_*n*, etc. More weight and volume savings are hence realized, because of the multiple functionality of PCMs 130_1, 1302, ..., 130_*n*.

Each one of the power conversion modules (PCMs) 130_1, 130_2, ..., 130_*n* can be designed to have independent power output and controls. The independent controls capability of the PCMs is used during the continuous operation, when the PCM modules supply power to individual loads and motors, such as ECS motors, hydraulic system motors, other aircraft systems, etc.

The PCMs 130_1, 130_2, ..., 130_*n* also include the capability and the interfaces required to communicate with each other, to use common controls during the main engine start, when the outputs of the PCMs are paralleled. During main engine start, when a certain number of PCMs are operated in parallel and used to supply the start power to a starter generator among 210_1, 210_2, ..., 210_*m*, two or more PCMs use the same controls supplied via a controls and communication interface 255. One of the PCM is the master and the other PCM(s) is/are the slave(s). In case the master PCM has a failure, it will be turned off and one of the remaining PCM controllers will become master and continue the start. The controls and communication interface 255 manages the PCM hierarchy based on PCM functionality. The PCMs 130_1, 130_2, ..., 130_*n* may control connections/switch arrangement for contactors 302_1*a*, 302_1*b*, 302_2*a*, 302_2*b*, ..., 302_*na*, 302_*nb* to enable combinations of different PCMs to be connected to a starter generator and at the same time to be disconnected from any individual loads. Contactors 302_1*a*, 302_1*b*, 302_2*a*, 302_2*b*, ..., 302_*na*, 302_*nb* may, alternatively or additionally, be controlled by the controls and communication interface 255.

For example, connections/switch arrangement for contactors 302_1*a*, 302_1*b*, 302_2*a*, 302_2*b*, ..., 302_*na*, 302_*nb* may be controlled to establish an independent PCM configuration, or an interdependent PCM configuration such as, for example, a paralleled PCM configuration. The contactors 302_1*a*, 302_1*b*, 302_2*a*, 302_2*b*, ..., 302_*na*, 302_*nb* may be separate units from PCMs 130_1, 130_2, ..., 130_*n*, or may be included in the PCMs 130_1, 130_2, ..., 130_*n*.

Figure 4A:
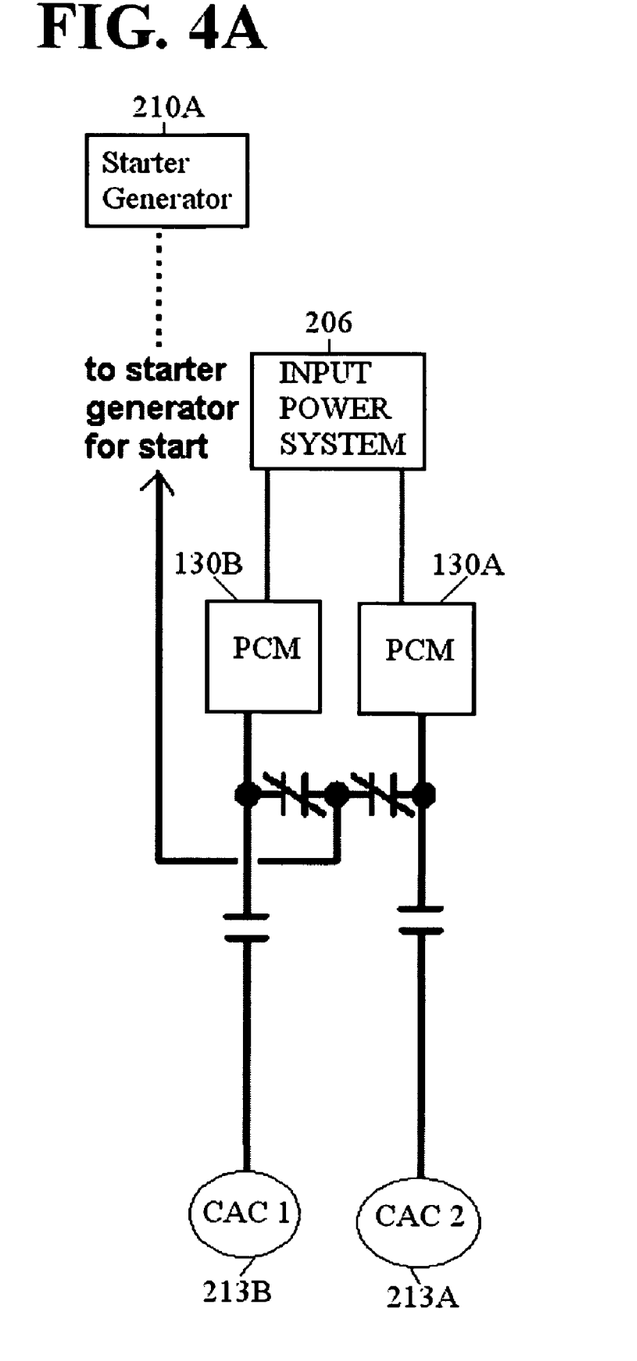
FIG. 4A is a block diagram of a system including two power conversion modules connected in parallel to supply power to a starter generator according to an embodiment of the present invention illustrated in FIG. 3.

FIG. 4A is a block diagram of a system including two power conversion modules connected in parallel to supply power to a starter generator according to an embodiment of the present invention illustrated in FIG. 3.

In typical/conventional aircraft systems, a start converter may have dual use as a motor controller, by powering a starter generator and a cabin air compressor (CAC) load sequentially. However, such a start converter used to power both a starter generator and a CAC load uses a large amount of power and is inefficiently used, because the start function for a starter generator typically requires power on the order of 100 kW, while a CAC load start function requires less power than the starter generator. Hence, the excess power capacity corresponding to the starter generator is not used when the start converter powers a CAC load, and the start converter is typically oversized for the use of powering a CAC.

As illustrated in FIG. 4A, two PCMs 130A and 130B are operated in parallel to provide power to a starter generator 210A for start. After providing power to starter generator 210A, the PCMs 130A and 130B are operated independently of each other, to provide power to CAC 1 (213B) and CAC 2 (213A). Hence, the output of the two PCMs 130A and 130B are combined during start of the system to obtain a larger start power (for starter generator 210A), and are decoupled after start, to obtain smaller powers (for loads 213A and 213B).

In an exemplary embodiment, instead of using a fixed 100 kW power controller to power a 100 kW starter generator and a 50 kW CAC, PCMs 130A and 130B, which provide 50 kW each, output 100 kW power for starter generator 210A when the PCMs 130A and 130B are operated together in parallel, and output 50 kW each for 2 separate loads, when the PCMs 130A and 130B are operated independently. Weight and volume system savings are hence achieved.

Figure 4B:
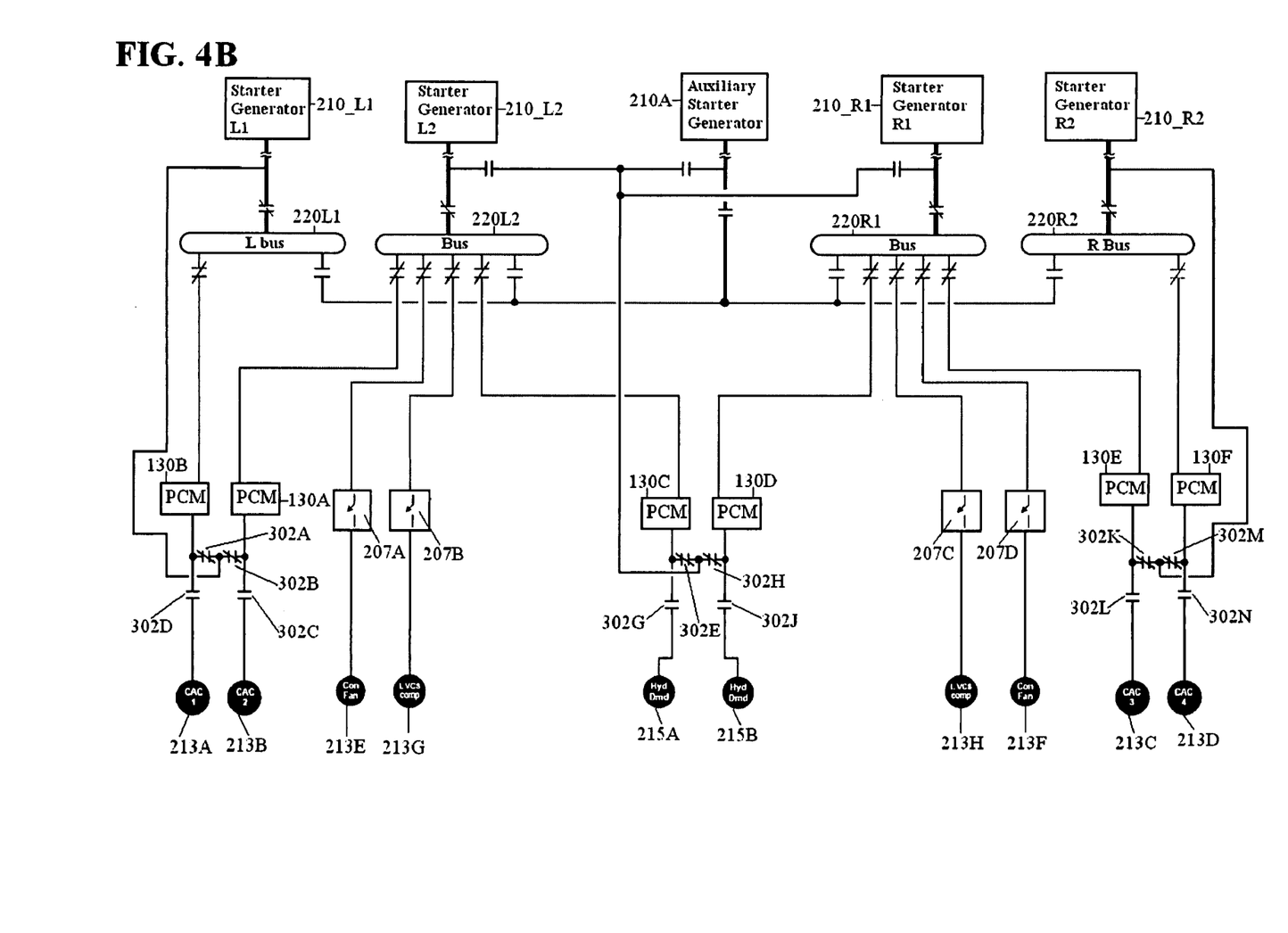
FIG. 4B is a block diagram of an exemplary modular and scalable power conversion system for aircraft according to an embodiment of the present invention illustrated in FIG. 3.

FIG. 4B is a block diagram of an exemplary modular and scalable power conversion system for aircraft according to an embodiment of the present invention illustrated in FIG. 3. In FIG. 4B, PCMs 130A and 130B are operated with their outputs in parallel during a main engine start with starter generator 210_L1, with PCMs 130A and 130B being controlled by a common control algorithm. The two contactors closer to the PCM at the output of each PCM module (contactors 302A and 302B), are closed. This contactor arrangement allows for start operation using one PCM module in the case of failure of the other module. After the start, these contactors (contactors 302A and 302B) are open and the contactor connection to Cabin Air Compressor (CAC) 1 (contactor 302D) and CAC 2 (contactor 302C) are closed. PCMs 130A and 130B are now operated independently, each supplying one CAC of the ECS, CAC 1 and 2 (213A and 213B). PCMs 130A and 130B are designed for continuous operation to drive the CAC 1 and CAC 2 (213A and 213B) and therefore weight and volume savings are realized.

Similarly, PCMs 130C and 130D are operated with their outputs in parallel during a main engine start using starter generator 210_L2, or starter generator 210_R1, or auxiliary starter generator 210A, and are controlled by a common control algorithm. After the start, PCMs 130C and 130D are operated independently, each supplying a motor driving the hydraulic system (215A and 215B).

PCMs 130E and 130F are also operated with their outputs in parallel during a main engine start using starter generator 210_R2 and are controlled by a common control algorithm. After the start, PCMs 130E and 130F are operated independently, each supplying a CAC load (213C and 213D).

General motor controllers 207A, 207B, 207C, and 207D are also present. Each general motor controller supplies only one load, such as: a condenser fan 213E, a vapor cycle system (VCS) 213G, a VCS 213H, and a condenser fan 213F.

The availability of the start system illustrated in FIG. 4B is increased, since the left engine start capability is 200% when both starter generators (210_L1 and 210_L2) and all four PCMs 130A, 130B, 130C, and 130D are available. The left engine start capability will degrade from 200% to 150% when any one of the PCMs 130A, 130B, 130C, and 130D fails. The left engine start capability will degrade to 100% when two PCMs among 130A, 130B, 130C, and 130D fail. In traditional/conventional aircraft start systems, the 150% engine start capability and availability step is non-existent. Also, since multiple PCMs are available per starter generator and engine as illustrated in FIG. 4B, the aircraft system can withstand more failures than a typical system with 2 generators and 2 start converters (one per generator). Using systems implemented in the current application, engine start can still be performed with a failed generator or any combination of 2 failed PCMs.

Figure 4C:
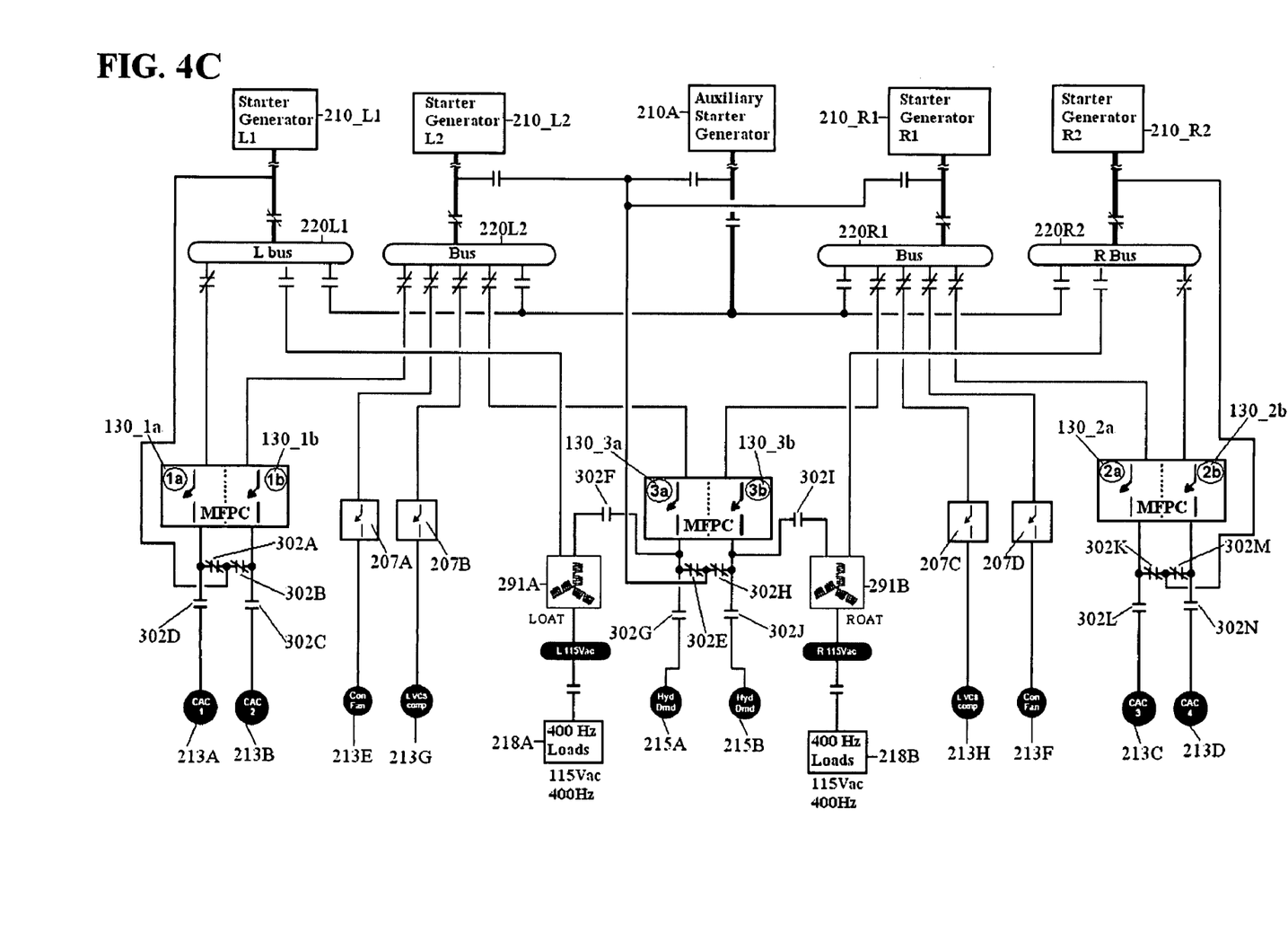
FIG. 4C is a block diagram of another exemplary modular and scalable power conversion system for aircraft according to an embodiment of the present invention illustrated in FIG. 3.

The PCMs in FIGS. 3, 4A and 4B may include Multiple Function Power Converters (MFPCs), described in the non-provisional application titled "An Architecture and a Multiple Function Power Converter for Aircraft", the entire contents of which are hereby incorporated by reference. When the PCMs include MFPCs, the PCMs can perform multiple functions, including functions of motor controllers, functions of static inverters, and functions of start converters, as illustrated in FIG. 4C. In FIG. 4C, MFPCs 130_1a and 130_1b are used in parallel to starter generator 210_L1, and are used afterwards to provide power to CAC 213A and 213B. MFPCs 130_2a and 130_2b are used in parallel to starter generator 210_R2, and are used afterwards to provide power to CAC 213C and 213D. MFPCs 130_3a and 130_3b are used in parallel to provide power to starter generators 210_L2 and 210_R1, and are used afterwards to provide power to hydraulic loads 215A and 215B, and to 400 Hz loads 218A and 218B through left and right autotransformers (OAT) 291A and 291B. 400 Hz is one of the standard frequencies used in aircraft electrical systems. While 400 Hz loads are shown in FIG. 4C, loads using other frequencies can also receive conditioned power from the MFPCs. MFPCs may provide power to loads using other constant or variable frequencies, such as loads associated with MEA aircraft.

Hence, the MFPCs in FIG. 4C perform functions for electric engine start, for driving the ECS or cabin air compressors, and functions of static inverters. In one exemplary embodiment, the MFPCs provide 115 VAC or 230 VAC, 3-phase, 400 Hz (or other standard frequencies used in aircraft electrical systems) electrical power for aircraft systems and equipment that require such power. Aircraft wiring saving may be achieved by using the generator main feeders during engine start, thus eliminating the need for dedicated feeders for start. Since MFPCs can perform the functions of motor controllers, start converters, and inverters, a reduced number of MFPCs is sufficient to power a variety of loads.

Figure 5:
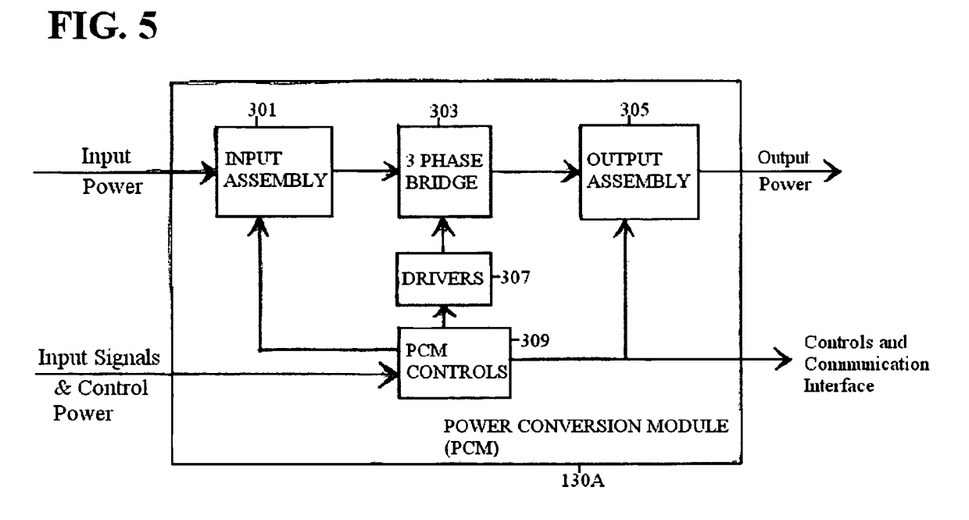
FIG. 5 is a block diagram illustrating an implementation for a power conversion module for a modular and scalable power conversion system for aircraft according to an embodiment of the present invention illustrated in FIG. 3.

FIG. 5 is a block diagram illustrating an implementation for a power conversion module (PCM) 130A for a modular and scalable power conversion system for aircraft according to an embodiment of the present invention illustrated in FIG. 3. As illustrated in FIG. 5, a PCM 130A includes: an input assembly 301; a 3 phase bridge 303; an output assembly 305; drivers 307; and power conversion module (PCM) controls 309. Input power passes through the input assembly 301, the 3 phase bridge 303, and the output assembly 305, from which output power is obtained. Input signals and control power are received at PCM controls 309, and an output for the controls and communication interface 255 (as illustrated in FIG. 3) is obtained. PCM controls 309 control the input assembly 301, the output assembly 305, and the 3 phase bridge 303.

The input assembly 301 contains filter elements and isolation devices. The isolation devices may be, for example, contactors or relays. The output assembly 305 contains filter elements and isolation devices. PCM controls 309 control states of the isolation devices included in the input assembly 301 and output assembly 305. PCM controls 309 also control the 3 phase bridge 303 via the drivers 307. In one embodiment, PCM controls 309 control switching of devices inside 3 phase bridge 303 via gate devices included in drivers 307.

The PCM 130A may be sized for main engine start (MES), or by other criteria. The size of the 3 phase bridge 303, and the size of the electromagnetic interference (EMI) filters and heat sink associated with the PCM 130A may be reduced, to obtain a compact PCM 130A.

By controlling isolation devices in the input assembly 301 and the output assembly 306, the 3-phase bridges 303 of neighboring PCMs can be coordinately driven for main engine start, for example in parallel for 3-phase Variable Frequency Starter Generators (VFSG), or at 30° shift for 6-phase VFSGs, etc.

In one embodiment, the 3-phase bridge 303 is compatible with high-power industrial equipment.

The power output from the output assembly 305 is used for main engine start or to drive motors and loads. In an exemplary embodiment, the output power from independent PCM channels is used to drive permanent magnet (PM) cabin air compressor (CAC) motors, and the 3 phase bridges 303 of the PCMs are rated for CAC at about 65 A/phase. In another exemplary embodiment, the output power from one PCM channel is used for main engine start (MES), and the 3 phase bridge 303 is rated for MES at about 220 A/phase for a limited start duration.

Embodiments of the current invention are not limited to the particular numbers of starter generators, or the particular number and types of loads illustrated, and can be used with any quantities and types of starter generators and loads. Although some aspects of the present invention have been described in the context of aerospace applications, the principles of the present invention are applicable to any environments that use electrical power, such as industrial environments, vehicles, ships, etc., to provide various amounts of power, at various frequencies.

We claim:

1. A power conversion apparatus, said apparatus comprising:
    a plurality of power conversion modules, said plurality of power conversion modules being controllable to
        function independently of each other to supply a plurality of systems, wherein the power conversion modules are able to independently provide power to different systems in the plurality of systems,
        function in an inter-relational mode in which at least one power conversion module from said plurality of power conversion modules drives a system and, upon a failure of said at least one power conversion module, at least another power conversion module from said plurality of power conversion modules will drive said system, and
        function in a scalable mode in which at least two power conversion modules of said plurality of power conversion modules are connected to provide an additive output, wherein an output current of the power conversion modules is controlled to provide said additive output,
    wherein at least two power conversion modules are each designed for separately supplying a lower power independently to those of the plurality of systems operable at said lower power and supply a higher power together in said scalable mode to those of the plurality of systems operable at said higher power; and
    a plurality of contactors, the contactors controlling whether one of the plurality of systems is powered by one or by more than one of the plurality of power conversion modules.

2. The apparatus according to claim 1, wherein said plurality of power conversion modules are designed and optimized for continuous operation when they function independently of each other to supply said plurality of systems.

3. The apparatus according to claim 1, wherein said plurality of systems are a plurality of motors and fixed frequency systems.

4. The apparatus according to claim 1, wherein said at least two power conversion modules are connected in parallel in said scalable mode, to supply start power to a starter generator.

5. The apparatus according to claim 1, wherein in said inter-relational mode each of said plurality of power conversion modules are connectable to any starter generator from a plurality of starter generators.

6. The apparatus according to claim 1, wherein said plurality of power conversion modules are used in the start mode of a starter generator in said inter-relational mode and said scalable mode, and thereafter are used independently of each other to supply a plurality of motors and fixed frequency systems.

7. The apparatus according to claim 1, wherein said plurality of power conversion modules include communication interfaces to communicate with each other and use common controls in said inter-relational mode and said scalable mode, during a main engine start.

8. The apparatus according to claim 1, wherein said plurality of power conversion modules include independent controls capability to function independently of each other and supply said plurality of systems.

9. The apparatus according to claim 1, wherein, in said inter-relational mode
at least a first and a second power conversion modules function in a scalable mode, being connected in parallel to drive said system,
said first and a second power conversion modules are controlled by one set of controls,
said first power conversion module is a master and said second power conversion module is a slave, and
upon a failure of said master, said master is turned off and said second power conversion module becomes a master.

10. A power conversion module, said power conversion module comprising:
an input assembly;
a three-phase bridge;
an output assembly including at least one isolation device; and
a control unit, wherein said control unit
controls said three-phase bridge via a driver, and
controls a state of said at least one isolation device within said output assembly, and
controls said power conversion module to function in one of:
an independent mode with a second power conversion module, so that said power conversion module drives only a first system and the second power control module drives only a second system,
an inter-relational mode with a second power conversion module, so that said power conversion module drives a system and, upon a failure of said power conversion module, said second power conversion module will drive said system, and
a scalable mode with a second power conversion module, so that said power conversion module and said second power conversion module are connected in parallel to provide an additive output.

11. The power conversion module according to claim 10, wherein said isolation device is a contactor or a relay.

12. The power conversion module according to claim 10, wherein said input assembly includes filter elements and at least one isolation device, and said output assembly includes filter elements.

13. The power conversion module according to claim 10, wherein
said input assembly receives input power, and
said control unit receives input signals and control power.

14. The power conversion module according to claim 10, wherein said control unit controls a phase of said 3 phase bridge via said driver.

15. The power conversion module according to claim 10, wherein
said input assembly receives input power,
said control unit receives input signals and control power, and outputs signals to a controls and communication interface, wherein said controls and communication interface connects said power conversion module to a second power conversion module, and
said output assembly outputs power to at least one of a starter generator, a motor, and a fixed frequency load.

16. A method for converting power, said method comprising:
controlling a plurality of power conversion modules to function independently of each other to supply a plurality of systems, wherein at least one of said plurality of systems receives power only from at least one of the plurality of power conversion modules;
controlling said plurality of power conversion modules to function in an inter-relational mode in which at least one power conversion module from said plurality of power conversion modules drives a system and, upon a failure of said at least one power conversion module, at least another power conversion module from said plurality of power conversion modules will drive said system; and
controlling said plurality of power conversion modules to function in a scalable mode in which at least two power conversion modules of said plurality of power conversion modules are connected to provide an additive output
wherein at least two power conversion modules are each designed for separately supplying a lower power independently and supplying a higher power together in said scalable mode.

17. The method for converting power as recited in claim 16, wherein
said step of controlling said plurality of power conversion modules to function in an inter-relational mode, and said step of controlling said plurality of power conversion modules to function in a scalable mode are performed in the start mode of a starter generator, and
said step of controlling a plurality of power conversion modules to function independently is performed thereafter to supply of plurality of motors and fixed frequency systems.

18. The method for converting power as recited in claim 16, wherein said step of
controlling said plurality of power conversion modules to function in an inter-relational mode
controls a first power conversion module to be a master and a second power conversion module to be a slave,
upon a failure of said master, turns off said master, and controls said slave to become a master.

* * * * *